(12) United States Patent
Ghali

(10) Patent No.: US 9,105,615 B1
(45) Date of Patent: Aug. 11, 2015

(54) SUBSTRATE VIAS FOR A DISPLAY DEVICE

(71) Applicant: Amazon Technologies, Inc., Reno, NV (US)

(72) Inventor: Hany Mounir Ghali, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/303,299

(22) Filed: Jun. 12, 2014

(51) Int. Cl.
*H01L 29/04* (2006.01)
*H01L 23/48* (2006.01)
*H01L 21/48* (2006.01)

(52) U.S. Cl.
CPC ............ *H01L 23/481* (2013.01); *H01L 21/486* (2013.01)

(58) Field of Classification Search
USPC ........................................................ 257/72
See application file for complete search history.

(56) References Cited

U.S. PATENT DOCUMENTS

| | | | | |
|---|---|---|---|---|
| 6,690,446 | B1 * | 2/2004 | Okamoto et al. | 349/181 |
| 2001/0002144 | A1 * | 5/2001 | Yamazaki | 349/44 |
| 2005/0280002 | A1 * | 12/2005 | Kang et al. | 257/72 |
| 2006/0238115 | A1 * | 10/2006 | Lee et al. | 313/504 |
| 2008/0094554 | A1 * | 4/2008 | Sato et al. | 349/114 |

* cited by examiner

*Primary Examiner* — Thao P Le
(74) *Attorney, Agent, or Firm* — Lee & Hayes, PLC

(57) ABSTRACT

An electronic device comprises a display stack that includes an active matrix display operable using thin film transistor (TFT) circuitry. The display stack also includes a light guide layer capable of illuminating the active matrix display. A glass substrate of the active matrix display has a first side and a second side opposite the first side, wherein the glass substrate includes the TFT circuitry disposed on the first side and one or more through-glass vias that electronically connect portions of the TFT circuitry disposed on the first side of the glass substrate to one or more electronic connectors or electronic circuitry disposed on the second side of the glass substrate.

20 Claims, 4 Drawing Sheets

SUBSTRATE VIAS FOR A DISPLAY DEVICE

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display can affect a user's experience with the electronic device and the content presented thereon. Accordingly, finding ways to enhance user experience and satisfaction continues to be a priority. Moreover, increased multimedia use imposes high demands on designs, packaging, and operations of display devices, as content available for mobile use becomes more extensive and device portability continues to be a high priority.

BRIEF DESCRIPTION OF THE DRAWINGS

The detailed description is described with reference to non-limiting and non-exhaustive embodiments illustrated in the accompanying figures. The same reference numerals in different figures refer to similar or identical items.

DETAILED DESCRIPTION

Overview

Figure 1:
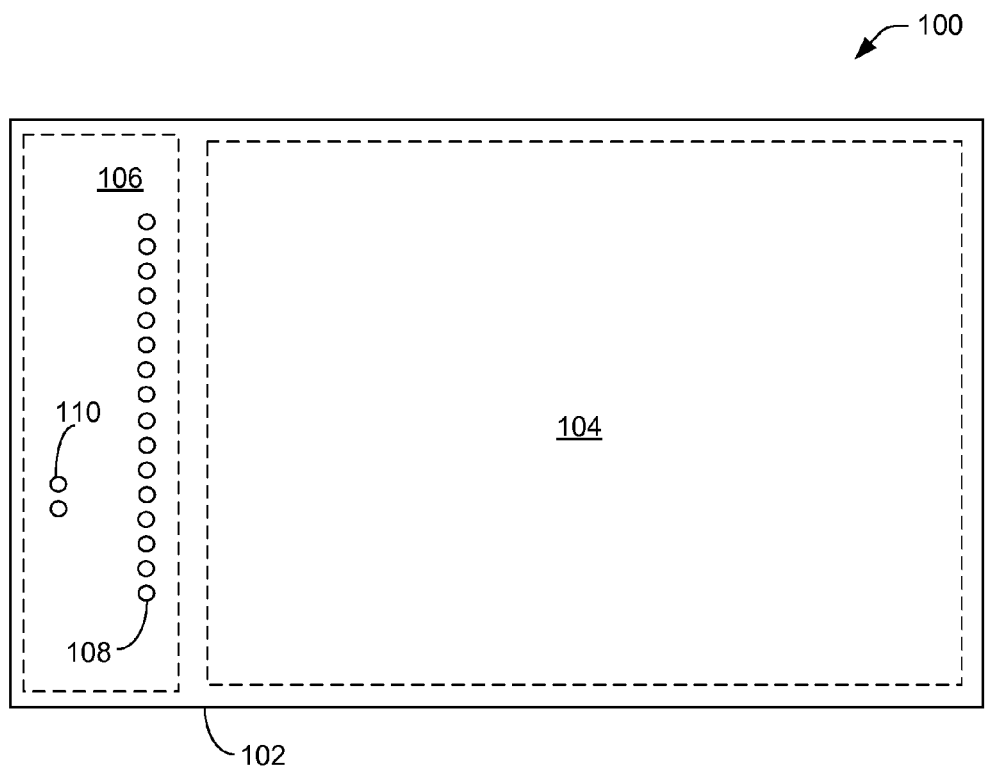
FIG. 1 shows a top view of a display device, according to some embodiments.

In various embodiments described herein, electronic devices include display devices for presenting content and other information. Display devices may include vias that subtend the thickness of a substrate to transfer electrical connections of thin film transistor (TFT) lines directly to the bottom side of the substrate. Thus, such vias can carry electrical signals and power between the circuitry on the top of the substrate and circuitry located in any other portion of the display device. For example, such vias can connect TFT circuitry on a top surface of the substrate to any of a number of circuits and/or components (e.g., a control board) located in other parts of a display device. Vias described herein can be included in transparent materials, such as glass or plastic substrates, for example. Vias, however, can be included in non-transparent, non-glass materials, such as semi-conductor or plastic substrates, for example. Because many of the examples embodiments describe vias included in transparent glass substrates, the term "through-glass" via is used herein, though claimed subject matter is not limited to glass or transparent substrates.

Through-glass vias in a substrate, which may be transparent, of a display device provide a number of benefits, such as allowing the configuration of the display device to avoid using a bonding region on the same surface of the substrate as the TFT circuitry, thus providing a number of low-profile design options. For example, a bonding region may include stand-offs or other electrical connectors that have a relatively tall profile. Placing an electrical bonding region on a bottom surface of a substrate instead of the top surface of the substrate, where TFT circuitry is located, can reduce space otherwise required for an electrical connector to connect an FPC to an electrical board or component located elsewhere in the display device. Some configurations include connections between TFT circuitry on the top of the substrate and an FPC on the bottom surface of the substrate, or using through-glass vias to directly connect between TFT circuitry on the top of the substrate and a PCB elsewhere in the display device, just to name a few examples. Without some of the benefits of through-glass vias, for instance, an FPC may undesirably fold around the edge of the substrate to utilize the space under the substrate.

Display devices may include a substrate layer, which is often glass, and various implementations of substrate vias that carry electrical signals and power through the glass layer are described. In some examples, the electronic devices may also include one or more additional components associated with the display, such as a touch sensor component layered atop the display for detecting touch inputs, a front light or back light component for lighting the display, and/or a cover layer component, which may include antiglare properties, antireflective properties, anti-fingerprint properties, anti-cracking properties, and the like. Various embodiments described herein also include techniques for assembling electronic devices including these component stacks for the displays and other features described herein.

A display device, such as a liquid crystal display (LCD), an electrophoretic display (EPD), or an electrowetting display (EWD), just to name a few examples, can be a transmissive or reflective display that generally includes an array of display elements (e.g., pixels or subpixels) configured to be operated by an active matrix addressing scheme. For example, rows and columns of electrowetting elements are operated by controlling voltage levels on a plurality of source lines and gate lines. In this fashion, the display device can produce an image by selecting particular display elements to transmit, reflect or block light. Display elements are addressed (e.g., selected) via rows and columns of the source lines and gate lines that are electrically connected to transistors (e.g., used as switches) included in each display element. Transistors take up a relatively small fraction of the area of each display element to allow light to efficiently pass through (or reflect from) the display element. Herein, a display element may, unless otherwise specified, comprise a pixel or subpixel of an LCD, EWD, EPD, or other display type. Such a pixel or subpixel may be the smallest light transmissive element of a display that is individually operable to directly control an amount of light transmission or reflection through the element. For example, in some implementations, a display element may be a pixel that includes a red subpixel, a green subpixel, and a blue subpixel. In other implementations, a display element may be a pixel that is a smallest component, e.g., the pixel does not include any subpixels.

In various embodiments, a display element of a display device includes, among other things, an electrode layer and a TFT that is switched to either select or deselect the electrowetting element using active matrix addressing. A TFT is a particular type of field-effect transistor that includes thin films of an active semiconductor layer as well as a dielectric layer and metallic contacts over a supporting (but non-conducting) substrate, which may be glass or any of a number of other transparent (or non-transparent) materials, for example.

In some embodiments, TFTs are fabricated onto a glass (or other transparent) substrate used in LCDs, EWDs, EPDs, or other display types. For example, TFTs may be disposed on a top surface of the glass substrate opposite the side of the substrate adjacent to the display elements. Individual source and gate lines interconnecting the TFTs and other circuit elements on the glass substrate may lead to one or more electrical contacts or connectors in a particular region of the substrate. For example, a periphery region at or near an edge of the substrate may be used primarily for electronics while other portions of the substrate are used primarily for the display elements. In some implementations, a flexible printed circuit (FPC) connector or other type of connector may be located in such a periphery region to electrically connect circuitry on the top of the substrate to any of a number of destinations, which may be above or below the substrate. For example, for a display device comprising a display stack of various components and/or layers, electrical connection may be between or among circuitry on the top of the substrate and circuitry on a printed circuit board (PCB) or control board located some distance away from the substrate. Such connections may be made by a flexible cable, for example.

In some embodiments, a display device as described herein can comprise a portion of a system that includes one or more processors and one or more computer memories, which may reside on a control board, for example. Display software can be stored on the one or more memories and can be operable with the one or more processors to modulate light that is received from an outside source (e.g., ambient room light) or out-coupled from a light guide of the display device. For example, display software can include code executable by a processor to modulate optical properties of individual pixels of the electrowetting display based, at least in part, on electronic signals representative of image or video data. The code can cause the processor to modulate the optical properties of pixels by controlling electrical signals (e.g., voltages, currents, fields, and so on) on, over, or in layers of the electrowetting display.

Figure 2:
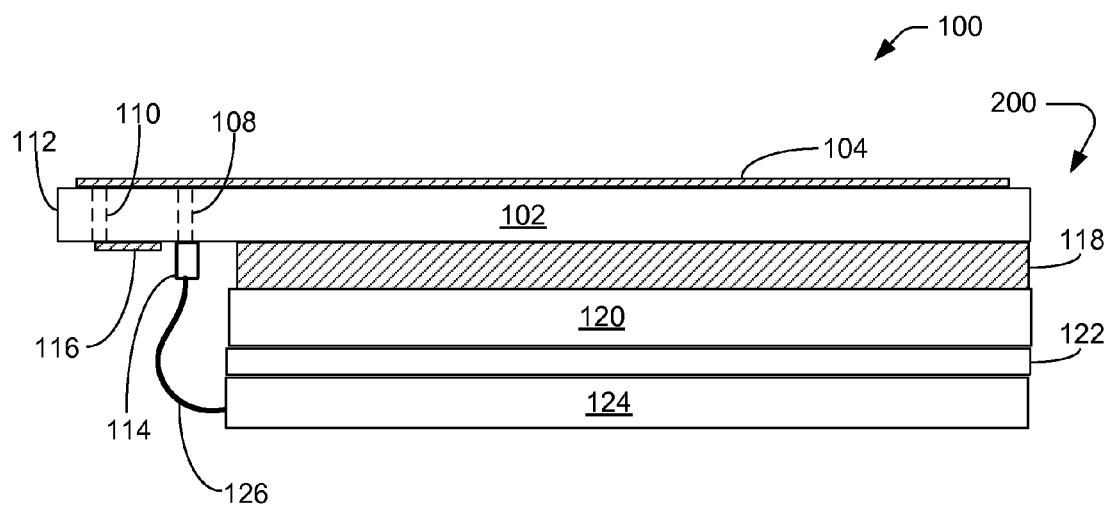
FIG. 2 shows a cross-section of a display device, according to some embodiments.

FIG. 1 shows a top view of a display device 100, while FIG. 2 shows a cross-section of the display device, according to some embodiments. Display device 100, which may be reflective with or without backlighting, comprises a display stack (shown in FIG. 2) including a number of various components and layers. In particular, a top portion of the display stack includes a substrate 102, which may be transparent or non-transparent glass, plastic (e.g., a transparent or non-transparent thermoplastic such as PMMA or other acrylic), or other material. For some display types, such as for EWDs, substrate 102 may be a support plate that, in cooperation with another transparent or non-transparent support plate, contains display elements that include electrowetting oil, electrolyte and pixel walls between the support plates. Support plate 102 includes a display element region 104 and a periphery region 106. Display element region 104 may comprise an array of pixels (and/or subpixels) that are individually manipulable to vary an amount of light that penetrates through, or reflects from, the individual pixels.

Display element region 104 may include rows of gate lines (not shown) for selecting particular pixels and columns of source lines (not shown) for electrically driving the selected pixels. Gate lines and source lines may comprise metallic or tin-doped indium-oxide (ITO) conductive traces on support plate 102. In some implementations, gate lines are electrically connected to gates of TFTs of individual pixels to select or deselect the pixels. Source lines are electrically connected to sources of the TFTs. The drains of the TFTs are electrically connected to optical portions of the pixels (e.g., a region that includes electrowetting oil and electrolyte solution). In other implementations, different types of TFTs (e.g., n-type or p-type) may be used so that sources and drains may be reversed in the example descriptions herein. Claimed subject matter is not limited in this respect.

Periphery region 106 includes electronic circuitry that is used to individually manipulate the individual pixels. Accordingly, a plurality of electrical conductors (e.g., rows and columns of source lines and gate lines) extend between display element region 104 and periphery region 106.

Periphery region 106 also includes through-glass vias 108 and 110 that provide conductive pathways from periphery region 106 on the top of support plate 102 to connectors, conductors, and/or components on the bottom of support plate 102 regions. In particular, cables or other conductors need not wrap around an end region 112, for example, of support plate 102 to interconnect wiring and/or circuitry on the top of support plate 102 to that on the bottom of support plate 102. Moreover, connectors to accommodate such cables that wrap around end region 112 may have an undesirably relatively high profile, whereas through-glass vias need not present a profile that extends above the surface of support plate 102.

Although periphery region 106, including through-glass vias, is shown in the embodiment of FIG. 1 to be on a left side of support plate 102, such a periphery region and/or through-glass vias may be located in any other region or portion of support plate 102. For example, in some implementations, periphery region 106 and through-glass vias (being disposed in any configuration) may be located in a right-hand region of support plate 102. In other implementations, periphery region 106 and through-glass vias (being disposed in any configuration) may be located in both right-hand and left-hand regions of support plate 102. In still other implementations, periphery region 106 and through-glass vias (being disposed in any configuration) may be located in any region of support plate 102 along a perimeter or any central region of support plate 102. Claimed subject matter is not limited in this respect.

Though any of a number of configurations is possible, through-glass vias 108 are in a single (as shown) or double line to correspond to one example layout of a connector 114 mounted on the bottom of support plate 102. Through-glass vias 110, of which only two of any possible number are shown, are in positions to contact portions of circuitry or conductors 116 on the bottom of support plate 102. Through-glass vias can, or course, be individually located in a substrate and need not occur in groups. Through-glass vias may comprise a portion of circuitry on the bottom of support plate 102, for example, that is used to control individual pixels in display element region 104.

FIG. 2 shows an example embodiment of a portion of a display stack 200 of display device 100. In this example, display stack 200 includes display component 118, bottom support plate 120, light guide 122, and control board 124. In some implementations, display component 118, support plate 102, and bottom support plate 120 together comprise an EWD or EPD, for example. In the case of display device 100 being a reflective EWD or EPD display, bottom support plate 120 need not be transparent and light guide 122 need not be present. However, light guide 122 may be present for an LCD display that uses back-lighting. Control board 124 may extend from below periphery region 106 to display element region 104, as shown in FIG. 2. Control board 124 may include circuitry and/or electrical components (e.g., a processor, micro-controller, ASIC, passive or active components, and so on) to control display component 118.

A cable 126, which may comprise any of a number of types or varieties of electrical conductors, may extend from the bottom of substrate 102 to any portion of display device 100. For example, as shown in an example implementation of FIG. 2, cable 126 extends from connector 114 to control board 124. Connector 114 may be electrically bonded to one or more through-glass vias 108, for example. In another example implementation, cable 126 may connect directly to through-glass vias 108 and extend to a direct solder connection on control board 124 or to a connector on control board 124. Such a direct connection between cable 126 and through-glass vias 108 may be made by a solder connection between conductors of cable 126 and the through-glass vias, thereby eliminating a use for connector 114.

Although through-glass vias and connectors, such as connector 114 and circuitry or conductors 116, are shown in the embodiment of FIG. 2 to be on a left side of display stack 200, such components may be located in any other region or portion of support plate 102 and display stack 200. For example, in some implementations, connections between cable 126 and control board 124 may be located in a right-hand region of display stack 200. In other implementations, such connections may be located in both right-hand regions, left-hand regions, periphery regions, and/or central regions of display stack 200. Claimed subject matter is not limited in this respect.

Figure 3:
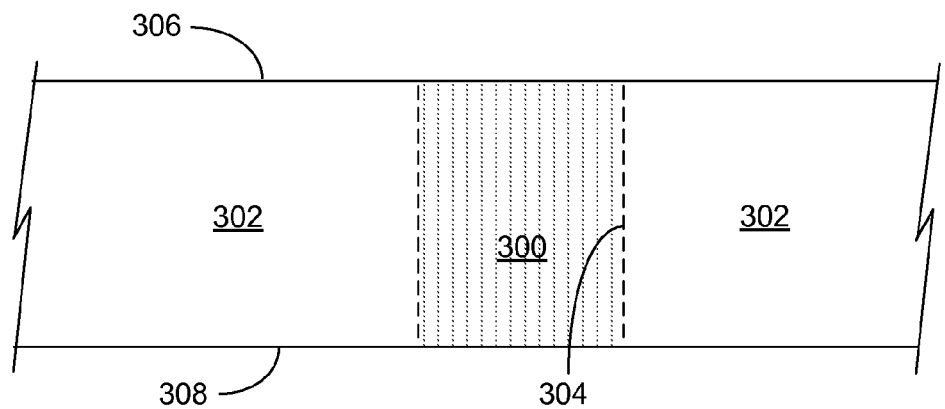
FIGS. 3 and 4 show cross-sections of a via in a portion of a substrate for a display device, according to some embodiments.

FIG. 3 shows a cross-section of a through-glass via 300 in a portion of a substrate 302 for a display device, according to some embodiments. Substrate 302 may be transparent or non-transparent. For example, the display device may be the same as or similar to display device 100 shown in FIGS. 1 and 2. Through-glass via 300 may comprise a hole 304 in substrate 302 that is filled with an electrically conductive material, such as metal, for example. In some implementations, hole 304 may be formed by a process of drilling a hole through substrate 302. In other implementations, hole 304 may be formed by a process of etching (e.g., chemical, reactive ion etching (RIE), plasma etching, UV Ozone treatment, and so on) substrate 302 to form the hole. Subsequent to its formation, hole 304 may be at least partially filled with conductive material by a deposition process, for example. Such conductive material may completely fill hole 304 or substantially cover the inside wall of hole 304. In some implementations involving substrate 302 being glass, conductive material may comprise a mixture or compound that includes metal particles in a glass matrix. Such a compound or mixture may desirably have physical characteristics, such as a thermal expansion coefficient, that are similar to or the same as those of the material of the substrate (e.g., glass). Accordingly, the combination of the conductive material and hole 304 forms through-glass via 300 that provides a conductive path between top surface 306 and bottom surface 308 of substrate 302.

Figure 4:
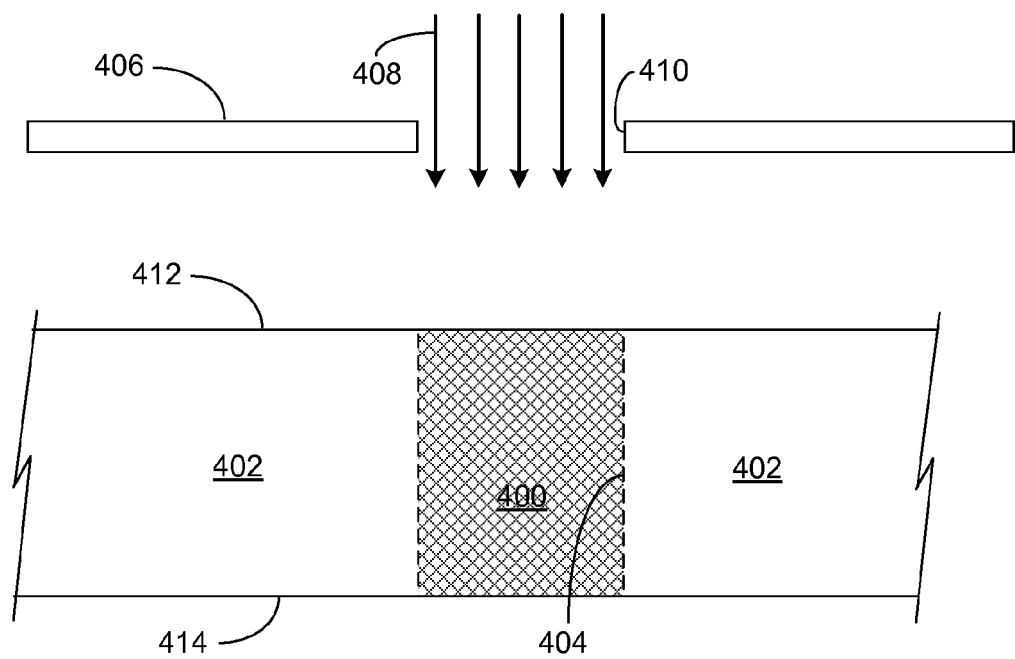

FIG. 4 shows a cross-section of a through-glass via 400 in a portion of a substrate 402 for a display device, according to some embodiments. Substrate 402 may be transparent or non-transparent. The display device may be the same as or similar to display device 100 shown in FIGS. 1 and 2. Through-glass via 400 need not comprise a hole, in contrast to through-glass via 300, which comprises hole 304 in substrate 302. Instead, through-glass via 400 may comprise a portion of substrate 402 that has been physically altered by a fabrication process to become electrically conductive glass. For example, a portion of substrate 402 substantially bounded by boundary 404 of through-glass via 400 may be subjected to ion implantation, where ions of a material are accelerated in an electrical field and impacted into substrate 402. For example, the ions can alter the elemental composition of substrate 402 if the ions differ in composition from substrate 402, stop in substrate 402, and remain there. Alternatively, or additionally, the ions can cause chemical and physical changes in substrate 402 by transferring their energy and momentum to electrons and atomic nuclei of substrate 402. For example, in one implementation, substrate 402 may comprise glass, and one or more vias included in substrate 402 may comprise the glass implanted with ions of a material different from the glass.

Using a mask 406, ion implantation is used to change the electrical conductive properties of substrate 402 inside boundary 404. Ions 408 of the material are accelerated through opening 410 in mask 406 and impacted into substrate 402. Subsequently, whereas substrate 402 is not electrically conductive outside boundary 404, substrate 402 is electrically conductive inside boundary 404, thus forming through-glass via 400. Accordingly, the ion-implanted substrate 402 inside boundary 404 forms through-glass via 400 that is a conductive path between top surface 412 and bottom surface 414 of substrate 402. It should be noted that the terms "top" and "bottom" are relative terms that are independent to the direction of gravity and independent of the direction of ion implantation.

Figure 5:
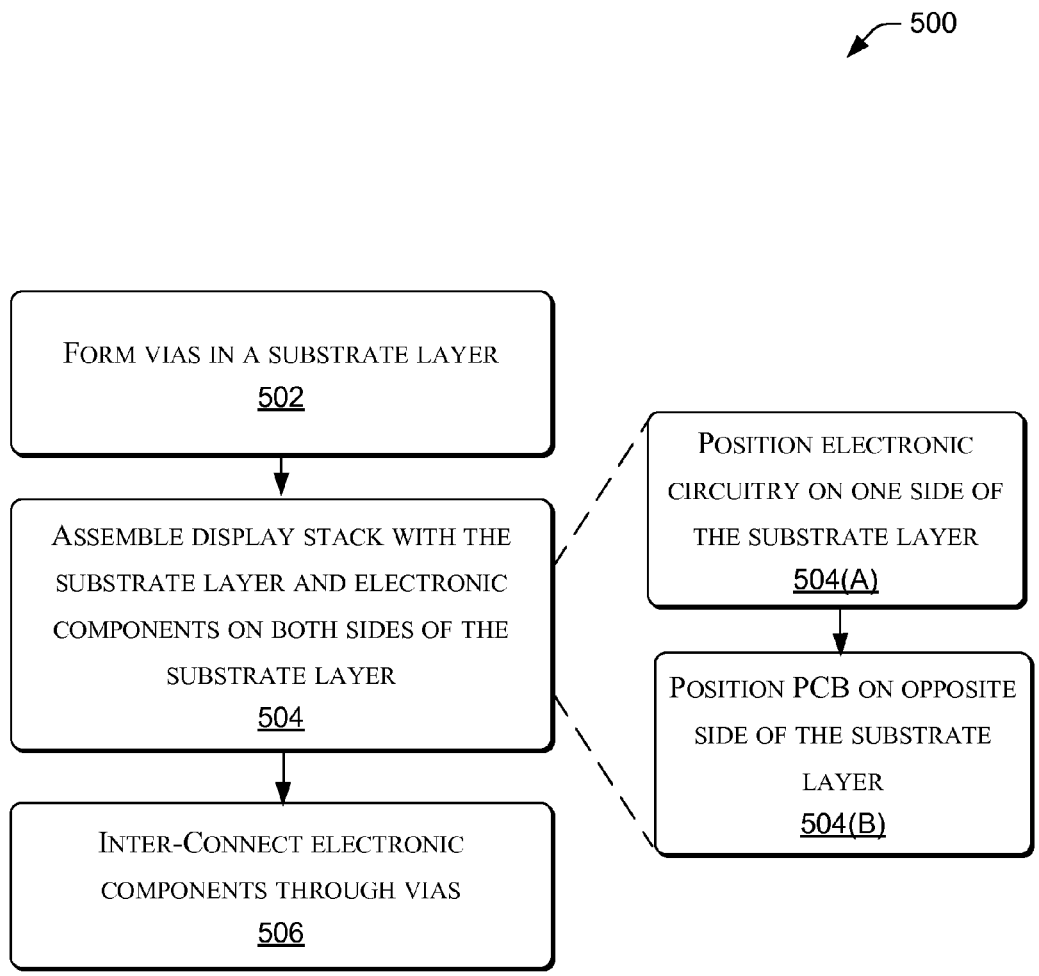
FIG. 5 is a flow diagram of a process for fabricating a display device, according to various example embodiments.

FIG. 5 is a flow diagram of a process 500 for fabricating a display device, according to various example embodiments. For example, the display device may be the same as or similar to display device 100 shown in FIGS. 1 and 2. The display device may include, among other things, an active matrix display component and a control circuit board. For example, an active matrix display component, such as a liquid crystal display (LCD) component, an electrophoretic display (EPD) component, or an electrowetting display (EWD) component, just to name a few examples, can be a transmissive or reflective display component that generally includes an array of display elements (e.g., pixels or subpixels) configured to be operated by an active matrix addressing scheme. For example, rows and columns of display elements are operated by controlling voltage levels on a plurality of source lines and gate lines. In this fashion, the display component can produce an image by selecting particular display elements to transmit, reflect or block light.

The display stack may comprise a layered structure including the active matrix display, the control circuit board, a light guide, a protective cover glass, and so on. The active matrix display may comprise an electrowetting display, an electrophoretic display, or a liquid crystal display, just to name a few examples.

At block 502, one or more vias are formed by any of a number of techniques in the transparent or non-transparent substrate layer of the active matrix display. For example, such vias may be formed by a process of drilling a hole through the substrate layer. In other implementations, a hole may be formed by a process of etching (e.g., chemical, RIE, plasma etching, UV Ozone treatment, and so on) the substrate layer to form the hole. Subsequent to its formation, the via hole may be at least partially filled with conductive material by a deposition process, for example. Such conductive material may completely fill the hole or substantially cover the inside wall of the hole.

In other implementations, vias may be formed by ion implantation to comprise a portion of the substrate layer that has been physically altered to become electrically conductive glass, as described above, for example.

At block 504, the display stack is assembled with the substrate layer and electronic components on both sides of the substrate layer. In some implementations, the electronic components, which may comprise TFT circuitry, are disposed on the substrate layer of the active matrix display. The substrate layer may comprise glass, plastic, transparent thermoplastic such as PMMA or other acrylic, or any of a number of materials. In the case of a glass transparent substrate, one or more of the vias may comprise conductive glass, such as that formed by ion implantation, for example. In another example, referring to the embodiment shown in FIG. 2, conductive traces (e.g., ITO) may reside on one side of the substrate layer and a control board may reside on the opposite side of the substrate layer.

Block 504 may further include block 504(A), where electronic circuitry is positioned on one side of the substrate layer. Additionally, at block 504(B), a printed circuit board is positioned on an opposite side of the substrate layer.

At block 506, electronic components on both sides of the substrate layer are inter-connected together through the vias in the substrate layer. Of course, a process for fabricating a display device may include any of a number of different or additional steps compared to process 500, and claimed subject matter is not so limited.

Figure 6:
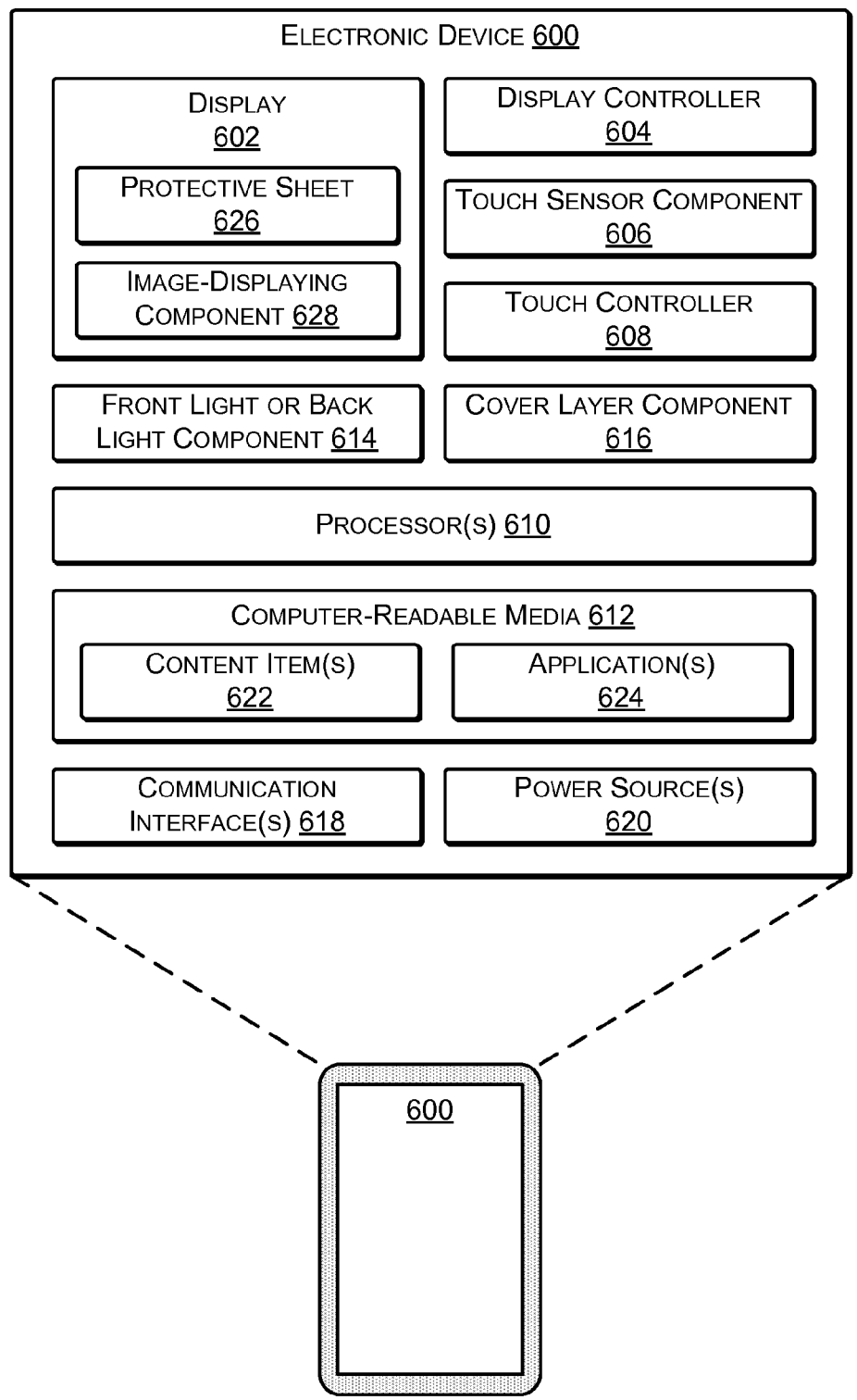
FIG. 6 illustrates an example electronic device that may incorporate a display device, according to some embodiments.

FIG. 6 illustrates an example electronic device 600 that may incorporate any of the display devices discussed above. The device 600 may comprise any type of electronic device having a display. For instance, the device 600 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 600 may be a non-mobile electronic device (e.g., a computer display, a television, etc.). In addition, while FIG. 6 illustrates several example components of the electronic device 600, it is to be appreciated that the device 600 may also include other conventional components, such as an operating system, system busses, input/output components, and the like. Further, in other examples, such as in the case of a television or computer monitor, the electronic device 600 may only include a subset of the components shown.

Regardless of the specific implementation of the electronic device 600, the device 600 includes a display 602 and a corresponding display controller 604. The display 602 may represent a reflective or transmissive display in some instances, such as an electronic paper display, a reflective or transmissive LCD display, or the like. Electronic paper displays represent an array of display technologies that largely mimic the look of ordinary ink on paper. In contrast to conventional backlit displays, electronic paper displays typically reflect light, much as ordinary paper does. In addition, electronic paper displays are often bi-stable, meaning that these displays are capable of holding text or other rendered images even when very little or no power is supplied to the display. Some examples of the display 602 that may be used with the implementations described herein include bi-stable LCD displays, micro electromechanical system (MEMS) displays, such as interferometric modulator displays, cholesteric displays, electrophoretic displays, electrofluidic pixel displays, electrowetting displays, photonic ink displays, gyricon displays, and the like. In other implementations, or for other types of devices 600, the display 602 may be an active display such as a liquid crystal display, a plasma display, a light emitting diode display, an organic light emitting diode display, and so forth. Accordingly, implementations herein are not limited to any particular display technology.

In an implementation, the display comprises an electrowetting display that employs an applied voltage to change the surface tension of a liquid in relation to a surface. For example, such an electrowetting display may include the array of pixels in element region 104 shown in FIGS. 1 and 2, though claimed subject matter is not limited in this respect. By applying a voltage to a hydrophobic surface, the wetting properties of the surface can be modified so that the surface becomes increasingly hydrophilic. As one example of an electrowetting display, the modification of the surface tension acts as an optical switch by contracting a colored oil film when a voltage is applied to individual pixels of the display. When the voltage is absent, the colored oil forms a continuous film within a pixel, and the color may thus be visible to a user of the display. On the other hand, when the voltage is applied to the pixel, the colored oil is displaced and the pixel becomes transparent. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content.

Of course, while several different examples have been given, it is to be appreciated that the reflective displays described herein may comprise any other type of electronic-paper technology or reflective-display technology, examples of which are provided above. In addition, while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 602 may represent a backlit display, examples of which are mentioned above.

In addition to including the display 602, FIG. 6 illustrates that some examples of the device 600 may include a touch sensor component 606 and a touch controller 608. In some instances, at least one touch sensor component 606 resides with, or is stacked on, the display 602 to form a touch-sensitive display (e.g., an electronic paper touch-sensitive display). Thus, the display 602 may be capable of both accepting user touch input and rendering content in response to or corresponding to the touch input. As several examples, the touch sensor component 606 may comprise a capacitive touch sensor, a force sensitive resistance (FSR), an interpolating force sensitive resistance (IFSR) sensor, or any other type of touch sensor. In some instances, the touch sensor component 606 is capable of detecting touches as well as determining an amount of pressure or force of these touches.

FIG. 6 further illustrates that the electronic device 600 may include one or more processors 610 and one or more computer-readable media 612, as well as a front light component 614 (which may alternatively be a backlight component in the case of a backlit display) for lighting the display 602, a cover layer component 616, such as a cover glass or cover sheet, one or more communication interfaces 618 and one or more power sources 620. The communication interfaces 618 may support both wired and wireless connection to various networks, such as cellular networks, radio, WiFi networks, short range networks (e.g., Bluetooth®), infrared (IR), and so forth. In some implementations, one or more processors may reside in a control board, such as control board 124, shown in FIG. 2.

Depending on the configuration of the electronic device 600, the computer-readable media 612 (and other computer-readable media described throughout) is an example of computer storage media and may include volatile and nonvolatile memory. Thus, the computer-readable media 612 may include, but is not limited to, RAM, ROM, EEPROM, flash memory, or other memory technology, or any other medium that can be used to store computer-readable instructions, programs, applications, media items, and/or data which can be accessed by the electronic device 600.

The computer-readable media 612 may be used to store any number of functional components that are executable on the processor 610, as well as content items 622 and applications 624. Thus, the computer-readable media 612 may include an operating system and a storage database to store one or more content items 622, such as eBooks, audio books, songs, videos, still images, and the like. The computer-readable media 612 of the electronic device 600 may also store one or more content presentation applications to render content items on the device 600. These content presentation applications may be implemented as various applications 624 depending upon the content items 622. For instance, the content presentation application may be an electronic book reader application for rending textual electronic books, an audio player for playing audio books or songs, a video player for playing video, and so forth.

In some instances, the electronic device 600 may couple to a cover (not shown in FIG. 6) to protect the display (and other components in the display stack or display assembly) of the device 600. In one example, the cover may include a back flap that covers a back portion of the device 600 and a front flap that covers the display 602 and the other components in the stack. The device 600 and/or the cover may include a sensor (e.g., a Hall effect sensor) to detect when the cover is open (i.e., when the front flap is not atop the display and other components). The sensor may send a signal to the front light component 614 when the cover is open and, in response, the front light component 614 may illuminate the display 602. When the cover is closed, meanwhile, the front light component 614 may receive a signal indicating that the cover has closed and, in response, the front light component 614 may turn off.

Furthermore, the amount of light emitted by the front light component 614 may vary. For instance, upon a user opening the cover, the light from the front light may gradually increase to its full illumination. In some instances, the device 600 includes an ambient light sensor (not shown in FIG. 6) and the amount of illumination of the front light component 614 may be based at least in part on the amount of ambient light detected by the ambient light sensor. For example, the front light component 614 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 602 may vary depending on whether the front light component 614 is on or off, or based on the amount of light provided by the front light component 614. For instance, the electronic device 600 may implement a larger default font or a greater contrast when the light is off compared to when the light is on. In some instances, the electronic device 600 maintains, when the light is on, a contrast ratio for the display that is within a certain defined percentage of the contrast ratio when the light is off.

As described above, the touch sensor component 606 may comprise a capacitive touch sensor that resides atop the display 602. In some examples, the touch sensor component 606 may be formed on or integrated with the cover layer component 616. In other examples, the touch sensor component 606 may be a separate component in the stack of the display assembly. The front light component 614 may reside atop or below the touch sensor component 606. In some instances, either the touch sensor component 606 or the front light component 614 is coupled to a top surface of a protective sheet 626 of the display 602. As one example, the front light component 614 may include a light guide sheet and a light source (not shown in FIG. 6). The lightguide sheet may comprise a substrate (e.g., a transparent thermoplastic such as PMMA or other acrylic), a layer of lacquer and multiple grating elements formed in the layer of lacquer that function to propagate light from the light source towards the display 602, thus illuminating the display 602.

The cover layer component 616 may include a transparent substrate or sheet having an outer layer that functions to reduce at least one of glare or reflection of ambient light incident on the electronic device 600. In some instances, the cover layer component 616 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, the protective sheet 626 may include a similar UV-cured hard coating on the outer surface. The cover layer component 616 may couple to another component or to the protective sheet 626 of the display 602. The cover layer component 616 may, in some instances, also include a UV filter, a UV-absorbing dye, or the like, for protecting components lower in the stack from UV light incident on the electronic device 600. In still other examples, the cover layer component 616 may include a sheet of high-strength glass having an antiglare and/or antireflective coating.

The display 602 includes the protective sheet 626 overlying an image-displaying component 628. For example, the display 602 may be preassembled to have the protective sheet 626 as an outer surface on the upper or image-viewing side of the display 602. Accordingly, the protective sheet 626 may be integral with and may overlie the image-displaying component 628. The protective sheet 626 may be optically transparent to enable a user to view, through the protective sheet 626, an image presented on the image-displaying component 628 of the display 602.

In some examples, the protective sheet 626 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 626 may include a coating, such as the hard coating described above. For instance, the hard coating may be applied to the outer surface of the protective sheet 626 before or after assembly of the protective sheet 626 with the image-displaying component 628 of the display 602. In some examples, the hard coating may include a photoinitiator or other reactive species in its composition, such as for curing the hard coating on the protective sheet 626. Furthermore, in some examples, the protective sheet 626 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 626, thereby protecting the image-displaying component 628 from UV light.

According to some implementations herein, one or more of the components discussed above may be coupled to the display 602 using liquid optically-clear adhesive (LOCA). For example, suppose that the light guide portion of the front light component 614 is to be coupled to the display 602. The light guide may be coupled to the display 602 by placing the LOCA on the outer or upper surface of the protective sheet 626. When the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 614 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 614. In other implementations, the LOCA may be placed near a center of the protective sheet 626, and pressed outwards towards a perimeter of the top surface of the protective sheet 626 by placing the front light component 614 on top of the LOCA. The LOCA may then be cured by directing UV light through the front light component 614. As discussed above, and as discussed additionally below, various techniques, such as surface treatment of the protective sheet, may be used to prevent discoloration of the LOCA and/or the protective sheet 626.

While FIG. 6 illustrates a few example components, the electronic device 600 may have additional features or functionality. For example, the device 600 may also include additional data storage devices (removable and/or non-removable) such as, for example, magnetic disks, optical disks, or tape. The additional data storage media, which may reside in a control board, such as control board 124 shown in FIG. 2, may include volatile and nonvolatile, removable and non-removable media implemented in any method or technology for storage of information, such as computer readable instructions, data structures, program modules, or other data. In addition, some or all of the functionality described as residing within the device 600 may reside remotely from the device 600 in some implementations. In these implementations, the device 600 may utilize the communication interfaces 618 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, apparatuses, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:
1. An electronic device comprising:
   a display stack including:
      an active matrix display layer having a glass substrate comprising:
         a first side and an opposing second side;
         thin film transistor (TFT) circuitry disposed on the first side;
         one or more electrical connectors or circuitry disposed on the second side; and
         a plurality of through-glass vias extending between the first side and the second side, the plurality of through-glass vias electrically connecting portions of the TFT circuitry to the one or more electrical connectors or the circuitry disposed on the second side; and
      a light guide layer configured to propagate light within the display stack.
2. The electronic device of claim 1, wherein the display stack further includes:
   a control board capable of electronically driving the active matrix display layer using the TFT circuitry, wherein the control board is electronically connected to the one or more through-glass vias on the second side of the active matrix display layer and the TFT circuitry is electronically connected to the one or more through-glass vias on the first side of the active matrix display layer.
3. The electronic device of claim 1, wherein the one or more through-glass vias comprise a hole at least partially filled with a conductive material.
4. The electronic device of claim 1, wherein the one or more electrical connectors disposed on the second side of the glass substrate comprise a flexible printed circuit (FPC) connector and wherein the circuitry disposed on the second side of the glass substrate comprises a printed circuit board (PCB).

5. An electronic display device comprising:
a display component; and
a transparent substrate adjacent to the display component, the transparent substrate having a first side and a second side opposite the first side, the transparent substrate including one or more vias that electrically connect electronic circuitry disposed on the first side of the transparent substrate to one or more electrical connectors or electronic circuitry disposed on the second side of the transparent substrate.

6. The electronic display device of claim 5, wherein the transparent substrate comprises a support plate of the display component, and wherein the display component comprises an electrowetting display, an electrophoretic display, or a liquid crystal display.

7. The electronic display device of claim 5, wherein the electronic circuitry disposed on the first side of the transparent substrate comprises thin film transistor (TFT) circuitry.

8. The electronic display device of claim 7, further comprising a control board coupled to the TFT circuitry, the control board configured to transmit signals to or receive signals from the TFT circuitry through the one or more vias.

9. The electronic display device of claim 5, wherein the one or more vias comprise a conductive material having a thermal expansion coefficient substantially the same as a thermal expansion coefficient of the transparent substrate.

10. The electronic display device of claim 5, wherein the second side of the transparent substrate includes an electronic connector electrically bonded to the one or more vias.

11. The electronic display device of claim 5, wherein the circuitry disposed on the second side of the transparent substrate comprises a printed circuit board (PCB) mounted directly to the second side of the transparent substrate.

12. The electronic display device of claim 5, further comprising:
a control board; and
a cable connecting an electrical connector from the one or more electrical connectors mounted to the second side of the transparent layer to the control board.

13. The electronic display device of claim 5, wherein the electronic circuitry disposed on the first side of the transparent substrate is fabricated using indium tin oxide (ITO).

14. The electronic display device of claim 5, wherein the transparent substrate comprises glass, and the one or more vias comprise the glass implanted with ions of a material different from the glass.

15. The electronic display device of claim 5, wherein the one or more vias comprise conductive glass.

16. An electronic display device comprising:
a first layer comprising an active matrix display; and
a second layer adjacent to the first layer, the second layer comprising a transparent substrate, the transparent substrate having a first side and a second side opposite the first side, the transparent substrate including vias that electrically connect electronic circuitry disposed on the first side of the transparent substrate to electrical connectors disposed on the second side of the transparent substrate.

17. The electronic display device of claim 16, wherein the electrical connectors disposed on the second side of the transparent substrate comprise a flexible printed circuit (FPC) connector mounted on the second side of the transparent layer.

18. The electronic display device of claim 16, wherein the first side of the transparent substrate does not include a bonding region.

19. The electronic display device of claim 16, wherein the first side of the transparent substrate does not include discrete electronic components.

20. The electronic display device of claim 16, wherein the second side of the transparent substrate further includes electrical circuitry connected to the electrical connectors.

* * * * *